United States Patent
Fedorov

(10) Patent No.: US 9,945,617 B2
(45) Date of Patent: Apr. 17, 2018

(54) THERMAL GROUND PLANES, THERMAL GROUND PLANE STRUCTURES, AND METHODS OF HEAT MANAGEMENT

(75) Inventor: Andrei G. Fedorov, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 2897 days.

(21) Appl. No.: 12/331,579

(22) Filed: Dec. 10, 2008

(65) Prior Publication Data

US 2009/0151923 A1 Jun. 18, 2009

Related U.S. Application Data

(60) Provisional application No. 61/014,125, filed on Dec. 17, 2007.

(51) Int. Cl.
*F28F 27/00* (2006.01)
*F28D 15/04* (2006.01)
*F28D 21/00* (2006.01)
*H01L 23/427* (2006.01)

(52) U.S. Cl.
CPC ....... *F28D 15/046* (2013.01); *F28D 21/0015* (2013.01); *H01L 23/427* (2013.01); *F28F 2245/02* (2013.01); *H01L 2924/0002* (2013.01)

(58) Field of Classification Search
CPC . F28D 15/046; F28D 21/0015; H01L 23/427; H01L 2924/0002; F28F 2245/02
USPC .... 165/274, 276, 272, 80.5, 104.21, 104.23, 165/104.25, 104.26, 104.28, 104.33; 361/700; 257/715; 174/15.2
See application file for complete search history.

(56) References Cited

U.S. PATENT DOCUMENTS 6,889,756 B1 * 5/2005 Hou .......................... 165/104.33
6,994,151 B2 * 2/2006 Zhou et al. ................. 165/80.4

OTHER PUBLICATIONS

Murthy, et al., "Single Chamber Compact Two-Phase Heat Spreaders with Microfabricated Boiling Enhancement Structures." IEEE Transactions on Components and Packaging Technologies, vol. 25, No. 1, Mar. 2002, pp. 156-163.
Launay, et al., "Hybrid micro-nano structured thermal interfaces for pool boiling heat transfer enhancement." Microelectronics Journal 37 (2006), pp. 1158-1164.

* cited by examiner

*Primary Examiner* — Travis Ruby
(74) *Attorney, Agent, or Firm* — Thomas Horstemeyer, LLP

(57) ABSTRACT

Thermal ground planes, thermal ground plane structures, and methods of thermal energy management, are disclosed. Embodiments of the disclosure provide for thermal ground planes and/or thermal ground plane structures for both fully passive and active two-phase heat spreaders, as well as the cooling devices and thermal management methods enabled by these planes and/or structures that enable heat dissipation from one or more high heat flux domains followed by spreading the heat laterally over a large area achieving essentially the spatially isothermal plane, structure, system, or device.

23 Claims, 3 Drawing Sheets

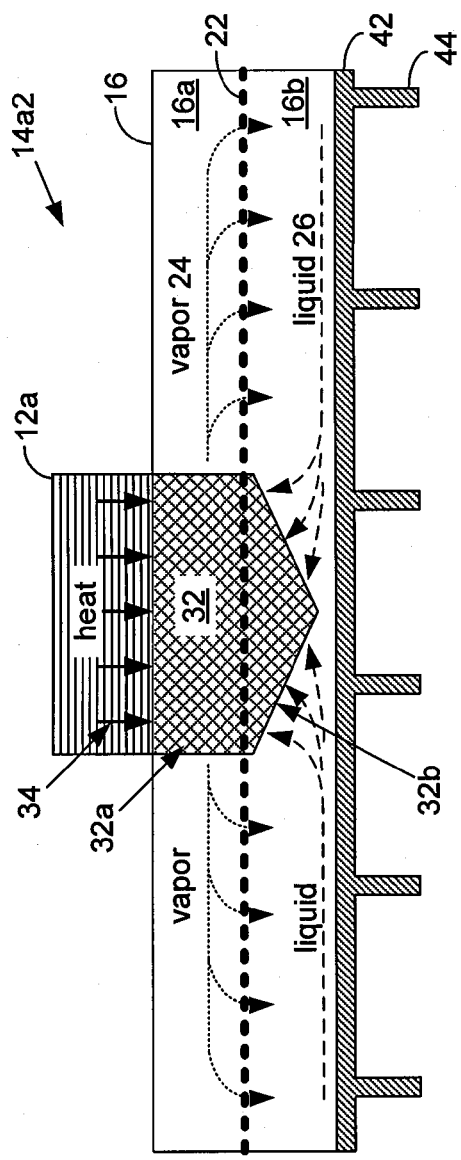
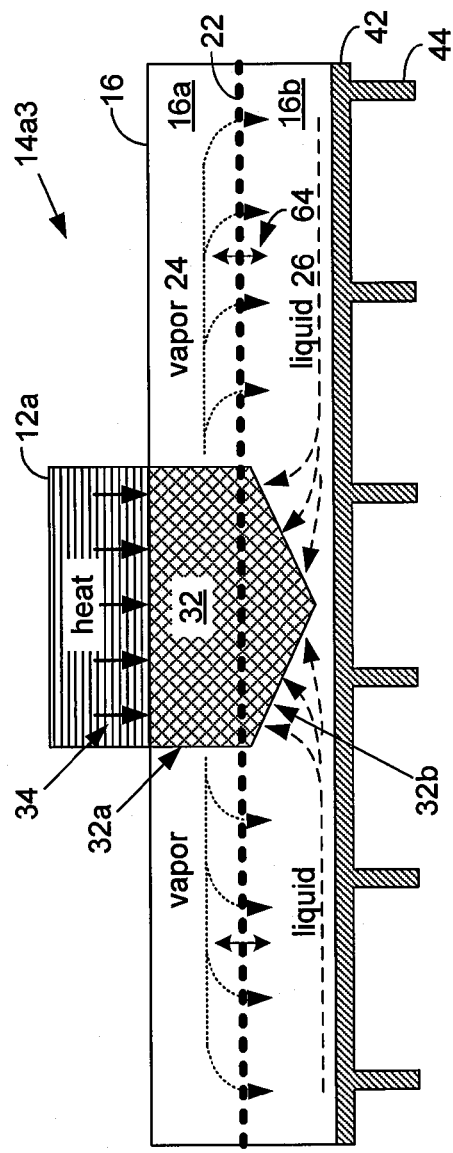

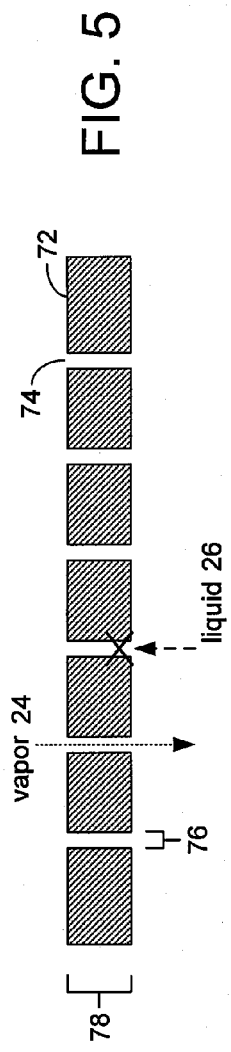
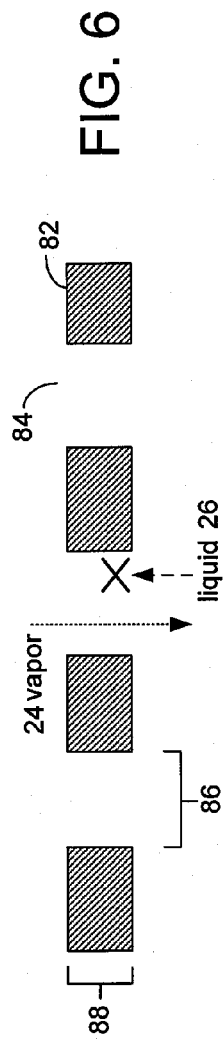
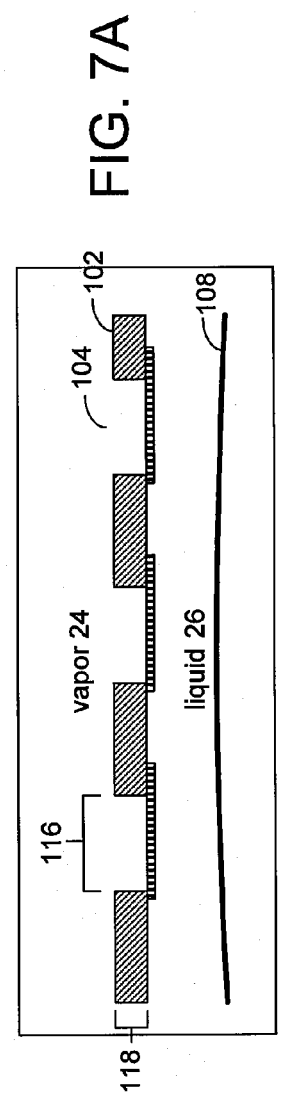
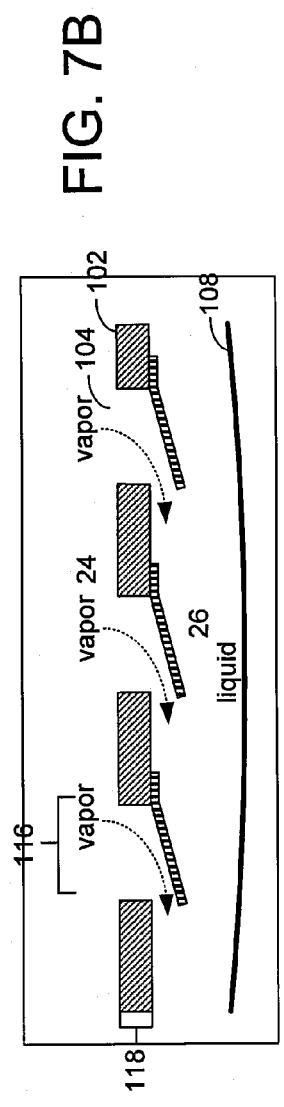

THERMAL GROUND PLANES, THERMAL GROUND PLANE STRUCTURES, AND METHODS OF HEAT MANAGEMENT

CROSS-REFERENCE TO RELATED APPLICATION

This application claims priority to U.S. provisional application entitled, "Active Thermal Ground Plane with Phase Separation," having Ser. No. 61/014,125, filed on Dec. 17, 2007, which is entirely incorporated herein by reference.

BACKGROUND

As electronic and optical devices and systems advance, they require greater power consumption, and thus, generate greater amounts of heat. Similarly, many energy conversion systems, such as fuel cells, batteries, power supplies, chemical and electrochemical energy storage, and many others, generate significant amounts of thermal energy as a result of their operation, which needs to be rejected to the environment. The problem of removing heat resulting from operation of devices and systems has grown from being an important concern to becoming a widely recognized bottleneck that limits further progress of high performance electronic, optical, and energy conversion and storage systems. Excessive heating affects not only the performance, but also the reliability of the components (e.g., computer chips) of the devices and systems. The heat generation from one component can causes performance and reliability problems for other components. Also, the heat generation can be general to a relatively large area and localized ("hot-spots") to a specific component. Air cooling is a common method of cooling and can be used in conjunction with heat sinks providing an increased surface area for heat dissipation. Other heat transfer devices include heat exchangers, liquid cooling microchannel heat sinks, and heat pipes.

Advances are needed in heat dissipation devices to better meet the cooling needs of current and future electronic and optical devices and energy conversion systems. The major challenges arise due to significant spatial and temporal non-uniformity of heat generation (i.e., localized domains with transient spikes of high heat fluxes imbedded within large device plains of modest or no heat generation) as well as the limited space in vertical (perpendicular to the device plane) direction for deployment of extended surfaces (fins) for increasing the heat transfer area. Thus, to overcome these challenges, there is a need for cooling methods, devices, and structures that produce a very large heat transfer coefficient locally (e.g., employing phase change heat transfer) in combination with the ability for highly efficient lateral spreading of heat over a large distance to achieve a large heat transfer surface for eventual rejection of heat to the ambient using air cooling.

In summary, highly non-uniform heat generation, limited access to the place in the device where most of heat generation occurs, and the need for low weight and compact system design pose significant challenges to development of the cooling system.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 3 illustrates a cross section (A-A) of a heat source 12a and thermal ground plane structure 14a (noted as thermal ground plane structure 14a2 in FIG. 3) shown in FIG. 1.

FIG. 4 illustrates a cross section (A-A) of a heat source 12a and thermal ground plane structure 14a (noted as thermal ground plane structure 14a3 in FIG. 4) shown in FIG. 1.

FIG. 5 illustrates an embodiment of a semi-permeable structure.

FIG. 6 illustrates an embodiment of a semi-permeable structure.

FIGS. 7A and 7B illustrate an embodiment of a semi-permeable structure

SUMMARY

Figure 1:
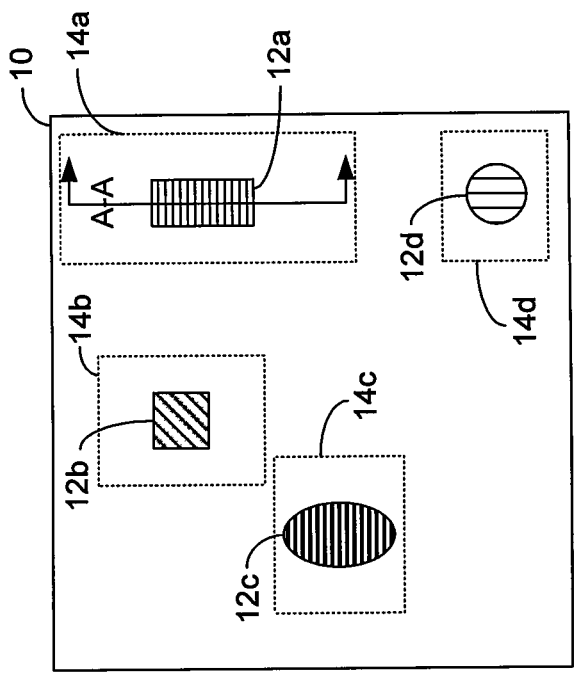
FIG. 1 illustrates a top view of a thermal ground plane.

Thermal ground planes, thermal ground plane structures, and methods of thermal energy management, are disclosed. In particular, embodiments of this disclosure include thermal ground plane structures and methods of removing and spreading thermal energy in a thermal ground plane, and the like.

One exemplary thermal ground plane structure, among others, includes: a phase separation structure having a vapor-filled area and a liquid-filled area, wherein the vapor-filled area and the liquid-filled area are separated by a semi-permeable structure, wherein the semi-permeable structure permits a vapor to be communicated from the vapor-filled area to the liquid-filled area and substantially prevents the liquid from being communicated from the liquid-filled area to the vapor-filled area; a porous high thermal conductivity structure disposed in a portion of the phase separation structure, wherein one side of the porous high thermal conductivity structure is adjacent to the thermal energy source, is in fluidic communication with a vapor-filled area of the phase separation structure and extends into a portion of the liquid-filled area of the phase separation structure, wherein the porous high thermal conductivity structure passes through an opening in the semi-permeable structure so that the semi-permeable structure is adjacent one or more sides of the porous high thermal conductivity structure, wherein the porous high thermal conductivity structure absorbs liquid through capillary action so that liquid from the liquid-filled area is communicated into a portion of the porous high thermal conductivity structure that extends into the vapor-filled area; and a heat dissipater structure disposed on an external area of the liquid-filled area of the phase separation structure; wherein the porous high thermal conductivity structure is adjacent a thermal energy source so that thermal energy from the thermal energy source is transferred to the porous high thermal conductivity structure, wherein the porous high thermal conductivity structure absorbs the thermal energy, wherein the porous high thermal conductivity structure transfers the thermal energy to the liquid in the porous high thermal conductivity structure to form a vapor, wherein the vapor is communicated out of the porous high thermal conductivity structure into the vapor-filled area, wherein the vapor is communicated through the semi-permeable structure into the liquid-filled area, wherein the vapor condenses into the liquid, and wherein thermal energy from the condensation process is transferred to the heat dissipater structure disposed on an external surface of the phase separation structure.

One exemplary method of removing and spreading thermal energy in a thermal ground plane, among others, includes: providing a thermal ground plane structure as described herein; generating thermal energy from a thermal energy source; communicating the thermal energy from the thermal energy structure to the porous high thermal conductivity structure, which absorbs the thermal energy; communicating the thermal energy absorbed by the porous high thermal conductivity structure to the liquid in the porous high thermal conductivity structure, wherein the liquid absorbs the thermal energy; generating vapor from the liquid upon the liquid absorbing the thermal energy from the porous high thermal conductivity structure, wherein the vapor flows out of the porous high thermal conductivity structure into the vapor-filled area; communicating the vapor through the semi-permeable structure into the liquid-filled area; condensing the vapor into a liquid in the liquid-filled area; and communicating the thermal energy from the condensation process to the heat dissipater structure disposed on an external surface of the phase separation structure.

One exemplary thermal ground plane structure, among others, includes: a phase separation structure having a vapor-filled area and a liquid-filled area, wherein the vapor-filled area and the liquid-filled area are separated by a semi-permeable structure, wherein the semi-permeable structure permits a vapor to be communicated from the vapor-filled area to the liquid-filled area and substantially prevents a liquid from being communicated from the liquid-filled area to the vapor-filled area; and a porous high thermal conductivity structure disposed in a portion of the phase separation structure, wherein one side of the porous high thermal conductivity structure is adjacent to a thermal energy source, is in fluidic communication with a vapor-filled area of the phase separation structure, and extends into a portion of the liquid-filled area of the phase separation structure, wherein the porous high thermal conductivity structure passes through an opening in the semi-permeable structure so that the semi-permeable structure is adjacent one or more sides of the porous high thermal conductivity structure.

One exemplary method of removing and spreading thermal energy in a thermal ground plane, among others, includes: providing a thermal ground plane structure that includes: a phase separation structure having a vapor-filled area and a liquid-filled area, wherein the vapor-filled area and the liquid-filled area are separated by a semi-permeable structure, wherein the semi-permeable structure permits a coolant vapor to be communicated from the vapor-filled area to the liquid-filled area and does not permit liquid to be communicated from the liquid-filled area to the vapor-filled area; a porous high thermal conductivity structure disposed in a portion of the phase separation structure, wherein one side of the porous high thermal conductivity structure is adjacent to a thermal energy source, is in fluidic communication with a vapor-filled area of the phase separation structure, and extends into a portion of the liquid-filled area of the phase separation structure, wherein the porous high thermal conductivity structure passes through an opening in the semi-permeable structure so that the porous high thermal conductivity structure is disposed in both the vapor-filled area and the liquid-filled area of the phase separation structure, wherein the opening of the semi-permeable structure is adjacent one or more sides of the porous high thermal conductivity structure; a heat dissipater structure disposed on an external surface of the liquid-filled area of the phase separation structure not within the liquid-filled area; a liquid disposed in the thermal ground plane structure; and a thermal energy source disposed adjacent the porous high thermal conductivity structure thermal energy; generating thermal energy from the thermal energy source; communicating the thermal energy from the thermal energy source to the porous high thermal conductivity structure, which absorbs the thermal energy; communicating the thermal energy absorbed by the porous high thermal conductivity structure to the liquid in the porous high thermal conductivity structure, wherein the liquid absorbs the thermal energy; generating vapor from the liquid upon the liquid absorbing the thermal energy from the porous high thermal conductivity structure, wherein the vapor flows out of the porous high thermal conductivity structure into the vapor-filled area; communicating the vapor through the semi-permeable structure into the liquid-filled area; condensing the vapor into a liquid in the liquid-filled area; and communicating the thermal energy from the condensation process to the heat dissipater structure disposed on an external surface of the phase separation structure.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of physics, thermodynamics, heat transfer, chemistry, material science, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmosphere. Standard temperature and pressure are defined as 25° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

As used herein, the term "adjacent" refers to the relative position of one or more features or structures, where such relative position can refer to being near or adjoining. Adjacent structures can be spaced apart from one another or can be in actual contact with one another. In some instances, adjacent structures can be coupled to one another or can be formed integrally with one another.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Discussion

Thermal ground planes, thermal ground plane structures, and methods of thermal energy management, are disclosed. Embodiments of the disclosure provide for thermal ground planes and/or thermal ground plane structures for both fully passive and active two-phase heat spreaders, as well as the cooling devices and thermal management methods enabled by these planes and/or structures that enable heat dissipation from one or more high heat flux domains followed by spreading the heat laterally over a large area achieving essentially the spatially isothermal plane, structure, system, or device. Embodiments of the present disclosure can achieve an extremely high effective thermal conductivity in the lateral direction, much greater than any of even the most conducting solids (e.g., diamond).

Embodiments of the present disclosure spread and reject thermal energy concentrated at one or more positions (e.g., produced by a heat source(s)) on a thermal ground plane to the entire thermal ground plane where the thermal energy is dissipated. Embodiments of the present disclosure are advantageous for at least the reason that low across-the-plane thermal resistance can be achieved because of the relative small thickness of the thermal ground plane and the high thermal conductivity of the thermal ground plane and/or the thermal ground plane structure. In addition, high in-plane effective thermal conductivity can be achieved using embodiments of the present disclosure because embodiments of the present disclosure use phase-change heat transfer that can be actively augmented, in some embodiments, by pressure driven transport of vapor and liquid. Fundamental limits associated with currently used systems that limit these systems are at least in part overcome by embodiments of the present disclosure. For example, embodiments of the present disclosure use a physical phase separation of vapor and liquid to achieve advantages over some current systems. In addition, an embodiment of the present disclosure uses active liquid and/or vapor transport to achieve advantages over some current systems. Furthermore, embodiments of the present disclosure use boiling/evaporation and condensation to communicate (e.g., transfer) thermal energy so that the thermal energy can be spread and dissipated by the thermal ground plane and the thermal ground plane structure. These advantages, as well as others, are discussed in greater detail in this disclosure and in the accompanying figures. The following figures are not intended to limit embodiments of the present disclosure but rather describe embodiments of the present disclosure.

FIG. 1 illustrates a top view of a thermal ground plane 10 having thermal energy sources 12a-12d associated with the thermal ground plane 10. The thermal energy sources 12a-12d are disposed in areas of the thermal ground plane 10 that are designated thermal ground plane structures 14a-14d since these structures dissipate thermal energy from the thermal energy sources 12a-12d. In general, a thermal ground plane can include one or more thermal ground plane structures. In an embodiment, for each thermal energy source, the thermal ground plane includes a corresponding thermal ground plane structure that is in thermal communication with the thermal energy source. In an embodiment, two or more thermal energy sources could be associated with a single thermal ground plane structure.

The thermal energy sources 12a-12d can include, but are not limited to, a computer chip, an electronic component, a display, an engine, a fuel cell or other power generation device (e.g., solar cell), a chemical reactor, a light source and detector, a battery, an electric power supply, a chemical storage system, and the like. The thermal energy sources 12a-12d can be the same or different thermal energy sources.

The thermal energy sources 12a-12d can be disposed (e.g., directly (in direct contact) or indirectly (in indirect contact (e.g., via an interface structure or material disposed between the thermal energy source and the thermal ground plane)) on the designated areas, thermal ground plane structures 14a-14d, of the thermal ground plane 10. In an embodiment, one or more of the thermal energy sources are disposed on the surface of the thermal ground plane. In an embodiment, one or more of the thermal energy sources 12a-12d are recessed within the thermal ground plane and/or disposed on a structure between the thermal energy source so that the thermal energy source is not in direct contact with the thermal ground plane.

The thermal ground plane 10 and the thermal ground plane structures 14a-14d function to dissipate the thermal energy and/or spread heat from each of the thermal energy sources 12a-12d so that the thermal energy is spread and/or dissipated throughout the thermal ground plane 10 and eventually rejected to the environment via heat exchange at the back side or at the periphery of a thermal ground plane using an extended surface(s) (fins) attached to the thermal ground plane structure. In general, the thermal ground plane structure is designed to operate independent of the orientation relative to the gravity field and to use separate pathways for transporting coolant vapor (away from the heat source) and coolant liquid (towards the heat source). This allows one to overcome the fundamental limits (e.g., capillary and sonic limits) on cooling performance associated with other phase-change based heat spreading devices such as heat pipes (see, for example, Peterson, G. P., 1994, *An Introduction to Heat Pipes: Modeling, Testing, and Applications*, John Wiley & Sons, New York, N.Y.).

Figure 2:
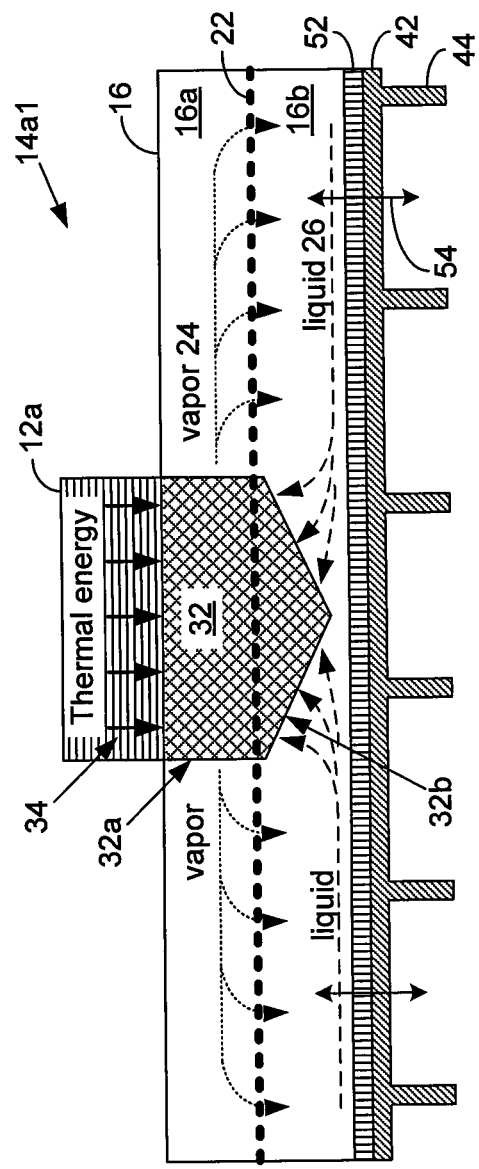
FIG. 2 illustrates a cross section (A-A) of the thermal ground plane and thermal ground plane structure 14a (noted as thermal ground plane structure 14a1 in FIG. 2) shown in FIG. 1.

The thermal ground plane structures 14a-14d are positioned within the thermal ground plane 10. In an embodiment, a portion of the thermal ground plane structure extends above the surface of the thermal ground plane. In another embodiment, the thermal ground plane structure is depressed below the surface of the thermal ground plane. In an embodiment and as shown in FIG. 2, the top of the thermal ground plane structure is flush with the surface of the thermal ground plane.

In general, the thermal ground plane structure can have dimensions that facilitate the removal of a significant amount of thermal energy from the thermal energy source. The amount of thermal energy can be about tenths of Watts per thermal energy source to about tens of kilowatts of dissipated power, depending on a specific application, so that the thermal ground plane stays isothermal or nearly isothermal with a small temperature variation (about 1 to 10 degrees Kelvin) about its baseline design value. The baseline operating temperature could vary from deep cryogenic temperatures (e.g., about 10-100 degrees Kelvin), to near ambient temperatures (e.g., about 273-373 degrees Kelvin), up to much higher temperatures (e.g., 800-1200 degrees Kelvin). Different operating temperatures will necessitate use of different liquid coolants (e.g., liquid nitrogen, methane, and ammonia for low temperature operation; water, methanol, and FC-72 for near-ambient operation; and liquid sodium, lithium, and silver for high temperature operation) as well as different operating pressures of the liquid coolant.

In an embodiment, the operating pressure is dependent at least upon the liquid and a desired operating temperature at which the thermal energy (heat) source is to be maintained. It can be uniquely determined from the saturation property relationship for any given substance. These values are well established and tabulated for different substances. In particular, most thermal management systems are designed to maintain a certain prescribed temperature of the thermal energy source, which in the limit of negligible superheat, will be equal to the saturation temperature of the liquid that undergoes the phase change (boiling/evaporation). For example, if the liquid is water and a target thermal energy source temperature is 100° C., then operation of the plane at 1 atm pressure will be sufficient to achieve water boiling/evaporation since the water saturation pressure at 100° C. is one atmosphere (about 101 kPa). In another example, if the target thermal energy source temperature is lower than 100° C., temperature operation at which phase change occurs is required, and with water as a coolant, the operating pressure will have to be reduced (e.g., about 88° C. operation needs pressure about 65 kPa, about 60° C. operation needs about 20 kPa, and about 17.5° C. operation needs about 2 kPa of pressure). If the operating pressure is fixed by mechanical/structural requirements, then operation at the target temperature can be achieved by choosing the liquid with the appropriate saturation temperature at a prescribed pressure. For example, if the operating pressure is fixed at 1 atmosphere, cryogenic temperature operation (about 77K) can be achieved by using liquid nitrogen, deep sub-ambient operation (about −164° C.) can be achieved using liquefied methane, near-ambient operation (about 65° C.) can be achieved with methanol, and high above ambient operation (about 1342° C.) can be achieved using liquid lithium as the liquid.

The dimensions of the thermal ground plane structure vary depending on the size of the thermal energy source, the thermal energy generated by the thermal energy source, the rate at which the thermal energy can be dissipated by the thermal ground plane structure, the liquid coolant used in the thermal ground plane structure, operating pressure, and combinations thereof. In general, the ratio of the area of the thermal ground plane structure to the thermal energy source is about 1 to 10. In an embodiment, the thermal ground plane can have a length of about 10 cm to 100 cm, a width of about 10 cm to 100 cm, and a thickness of about 1 mm to 1 cm.

The footprint (geometry) of a thermal energy source and of a thermal ground plane can vary, including circular, rectangular, square, polygonal, and other shapes.

FIG. 2 illustrates a cross section (A-A) of the thermal energy source 12a and thermal ground plane structure 14a (noted as thermal ground plane structure 14a1 in FIG. 2) shown in FIG. 1. The thermal ground plane structure 14a1 includes a phase separation structure 16 dividing the structure into an area 16a (also referred to as "a vapor-filled area 16a") and an area 16b (also referred to as "a liquid-filled area 16b"). A portion of the entire thermal ground plane structure 14a1 and/or the thermal ground plane 10 can be directly (in direct contact) or indirectly (e.g., with a separation structure or other structure (e.g., actuator) disposed between the thermal ground plane structure 14a1) interfaced with a heat dissipater structure 42, where the heat dissipater structure 42 is disposed on a portion or on the entire bottom side (the side opposite the thermal heat source) of the phase separation structure 16.

In an embodiment, the heat dissipater structure 42 can be similar to or the same as a heat sink for a heat source structure such as a computer chip or a radiator for air cooling of a power source such as a heat engine. The heat dissipater structure 42 may include fins, pin-fin arrays, or other extended surfaces commonly used for heat transfer enhancement.

The heat dissipater structure 42 can be made of solid or porous materials (preferably with high thermal conductivity) such as, but not limited to, copper, aluminum, silicon, diamond, steel, carbon, different polymers, or composite materials, and combinations thereof.

It should be noted that two or more layers of heat dissipater structures could be used to enhance heat dissipation and/or spreading capabilities. In addition, two or more layers of heat dissipaters can be used to dissipate heat in vertically integrated packages, for example.

In an embodiment, the phase separation structure 16 has a height or thickness of about 10 μm to 100 μm or about 1 mm to 10 mm. As noted above about the area (e.g., the length and width) of the thermal ground plane structure 14a1, the dimensions, including height, of the phase separation structure 16 depend upon a number of variables such as those noted above. In this regard, the dimensions of the thermal ground plane can be designed to remove the thermal energy of the thermal energy source as described in detail herein.

The three-dimensional shape of the phase separation structure 16 can include, but is not limited to, a rectangular box, a square box, a polygonal box, a cylinder, and the like.

As mentioned above, the phase separation structure 16 is separated into a vapor-filled area 16a and a liquid-filled area 16b that are separated by a semi-permeable (permeable to vapor and substantially (less than 1%, less than 2%, less than 3%, or less than 5%, depending upon on the liquid, the semi-permeable structure, and the like) non-permeable to liquid) structure 22. The semi-permeable structure 22 can be positioned at about the mid-way point of the height of the phase separation structure 16. In another embodiment, the semi-permeable structure 22 can be positioned closer to the top of the phase separation structure 16 or the lower portion of the phase separation structure 16 as long as the thermal ground plane structure 14a1 and the thermal ground plane 10 operate consistent with the teachings of this disclosure. Typically, because of much higher density of a coolant in the liquid phase, the volume of the liquid-filled area 16b (or chamber) is much smaller (e.g., about 100 to 1000 times smaller by volume, but the amount is dependent upon the liquid, the operating mode, and the like) than that of a vapor-filled area 16a.

The thermal ground plane structure 14a1 can include a liquid 26 (also as referred to as "coolant liquid"). As described herein, the liquid is converted into a vapor. In an embodiment, the liquid 26 can include, but is not limited to, water, liquid nitrogen, ammonia, a fluorocarbon (e.g., FC-72), and a liquid metal (e.g., liquid sodium, liquid lithium, silver, and the like). In an embodiment, the type and/or amount or volume of liquid 26 in the thermal ground plane structure 14a1 depends, at least in part, upon one or more of the features and functions of the thermal ground plane structure 14a1 such as the operating temperature and/or pressure of the thermal ground plane 10, the amount of thermal energy that needs to be dissipated, the materials of the thermal ground plane 10, the type of heat source that is being cooled and its operating requirements, the volume of the phase separation structure 16, the type and/or physico-chemical properties of the semi-permeable structure 22, the type, structure, and/or physico-chemical properties of the porous high thermal conductivity structure 32, the thermal energy expected to be dissipated, the physical (e.g., boiling point, dew point of the liquid, and the like) characteristics of the liquid 26, and the like. In an embodiment, the amount of liquid 26 in the phase change structure is about 1 microliter ($\mu$l) to 100 milliliters (ml). In an embodiment, the liquid 26 may initially be within the porous high thermal conductivity structure 32 due, in part, to the structural and/or physical (e.g., surface properties such as wettability) characteristics of the porous high thermal conductivity structure 32.

The semi-permeable structure 22 permits a liquid coolant vapor 24 (also referred to as "vapor") to be communicated (e.g., flow, move, transport, or the like) from the vapor-filled area 16a to the liquid-filled area 16b of the phase separation structure 16 and does not permit liquid coolant 26 to be communicated (e.g., flow, move, transport, or the like) from the liquid-filled area 16b to the vapor-filled area 16a through the semi-permeable structure 22 (it should be noted the liquid 26 can move via the porous high thermal conductivity structure 32 to the vapor-filled area 16a). Additional details regarding embodiments of the semi-permeable structure 22 are described below.

Embodiments of the thermal ground plane structure 14a1 include a porous high thermal conductivity structure 32. The porous high thermal conductivity structure 32 is positioned in a portion of the phase separation structure 16. One portion of the porous high thermal conductivity structure 32a is located within the vapor-filled area 16a and is placed in thermal communication (via direct contact or indirectly via thermal interface structure or material) with the thermal energy source 12a; another portion of the porous high thermal conductivity structure 32b partially extends into the liquid-filled area 16b. The porous high thermal conductivity structure 32 passes through an opening in the semi-permeable structure 22 so that the semi-permeable structure 22 is adjacent one or more sides of the porous high thermal conductivity structure 32.

In an embodiment, the porous high thermal conductivity structure 32 can have a cross-sectional shape that conforms to the cross-section of the thermal energy source 12a. In an embodiment, the porous high thermal conductivity structure 32 has a cross-sectional shape that is different than the thermal energy source 12a but facilitates the communication of the thermal energy to the porous high thermal conductivity structure 32 so that the thermal ground plane structure 14a and the thermal ground plane can dissipate the thermal energy consistent with the teachings of this disclosure.

In an embodiment, the porous high thermal conductivity structure 32 can have various three-dimensional shapes and internal pore structures. The three-dimensional shape of the porous high thermal conductivity structure 32 should allow for the thermal energy to be communicated from the thermal energy source 12a to the porous high thermal conductivity structure 32, allow for the communication of the thermal energy from the porous high thermal conductivity structure 32 to the liquid 26 within the porous high thermal conductivity structure 32, allow for the communication of the vapor 24 from the porous high thermal conductivity structure 32 to the vapor-filled area 16a of the phase separation structure 16, allow for the communication of the liquid 26 in the liquid-filled area 16b into the porous high thermal conductivity structure 32, allow for liquid evaporation into vapor 24 within the inner pores of the porous high thermal conductivity structure 32 to flow the vapor to the vapor-filled area 16a of the phase separation structure 16, and combinations thereof. In an embodiment, the porous high thermal conductivity structure 32 can have a three-dimensional structure that is conical, rectangular box, square box, polygonal box, spherical or hemispherical, cylindrical, and combinations of each (e.g., rectangular box on the upper portion and conical on the lower portion of the porous high thermal conductivity structure 32 or the like).

The porous high thermal conductivity structure 32 can have a height so that the porous high thermal conductivity structure 32 extends from the vapor-filled area 16a of the phase separation structure 16 to the liquid-filled area 16b of the phase separation structure 16. The porous high thermal conductivity structure 32 extends into the liquid-filled area 16b a distance so that the liquid 26 can be communicated (e.g., flow, drawn, (e.g., capillary action), and the like) into the porous high thermal conductivity structure 32. In an embodiment, the porous high thermal conductivity structure 32 can extend into about a length of about 95%, about 90%, about 85%, about 80%, about 70%, about 60%, about 50%, about 40%, about 30%, about 20%, about 10%, or about 0% of the height of the liquid-filled area 16b.

In an embodiment, the ratio of the volume of the porous high thermal conductivity structure 32 to the volume of the phase separation structure is about 1 to 100 or about 100 to 1000.

In an embodiment, the porous high thermal conductivity structure 32 can have a volume of about 0.1 cm$^3$ to 100 cm$^3$ or about 100 cm$^3$ to 0.1 m$^3$.

In an embodiment, the porous high thermal conductivity structure 32 has a thermal conductivity of about 100 to 5000 W/mK or about 500 to 5000 W/mK.

In an embodiment, the porous high thermal conductivity structure 32 has porosity (void fraction) of about 0.3 to 0.6 or about 0.6 to 0.9.

The porous high thermal conductivity structure 32 can be made of materials such as, but not limited to, copper, aluminum, silicon, diamond, brass, carbon, arrays of carbon nanotubes and nanowires, and combinations thereof (see, for example, S. Launay, A. Fedorov, Y. Joshi, A. Cao, and P. Ajayan, "Hybrid Micro-Nano Structured Thermal Interface for Pool Boiling Heat Transfer Enhancement", *Microelectronics Journal*, 37 (11), pp. 1158-1164, 2006). In an embodiment, the material and/or the porous structure provide a capillary action to draw liquid 26 into the porous high thermal conductivity structure 32. In an embodiment, the material and/or the porous structure are hydrophilic and draw the liquid 26 into the porous high thermal conductivity structure 32.

Embodiments of the porous high thermal conductivity structure 32 are designed so that the liquid 26 is dispersed throughout the porous high thermal conductivity structure 32, in particular, into the upper portion of the porous high thermal conductivity structure 32a so that the thermal energy can convert the liquid 26 into a vapor 24. In an embodiment, the porous structure of the porous high thermal conductivity structure 32 is designed so that the pores increase in diameter from the center of the porous high thermal conductivity structure 32 located near the thermal energy source 12a to the periphery of the porous high thermal conductivity structure 32 so that liquid 26 will experience stronger capillary forces to be drawn from the liquid-filled area 16b to fully fill the porous high thermal conductivity structure 32 and the vapor 24 has a low hydraulic resistance path to escape the porous structure into the vapor-filled area 16a. In an embodiment, the pores of the porous high thermal conductivity structure 32 are about 50 nm to 10 μm or about 10 to 100 μm in diameter.

In an embodiment, the material that is used to make the porous high thermal conductivity structure 32 can be coated (e.g., the entire structure or portions of the structure to achieve the desired function of the porous high thermal conductivity structure 32) with a secondary material that enhances the capillary effect and/or the communication of the thermal energy from the porous high thermal conductivity structure 32 to the liquid 26. The secondary materials can include, but are not limited to, a polymer coating (e.g., U.S. Pat. No. 6,238,799 and U.S. Pat. No. 6,866,936), a nanostructure superhydrophilic material, oxides (e.g., $SiO_2$, $HfO_2$, $ZrO_2$, $Al_2O_3$, $SnO_2$, $Ta_2O_5$, $Nb_2O_5$, $MoO_2$, $IrO_2$, and $RuO_2$), a metastable oxynitride, a nonstoichiometric metal oxide, an oxynitride, mixtures of any of these, and combinations thereof.

In an embodiment, the porous high thermal conductivity structure 32 absorbs liquid 26 through capillary action so that liquid 26 from the liquid-filled area 16b is communicated (e.g., flows, drawn, moves, travels, and the like) into the upper area of porous high thermal conductivity structure 32b. The liquid 26 disperses throughout the porous high thermal conductivity structure 32 so that the liquid 26 occupies at least a portion of at least the upper portion of the porous high thermal conductivity structure 32a.

In an embodiment, the porous high thermal conductivity structure 32 is adjacent a thermal energy source 12a so that thermal energy 34 from the thermal energy source 12a is communicated (e.g., flows, moves, transfers, and the like) to the porous high thermal conductivity structure 32. The porous high thermal conductivity structure 32 absorbs the thermal energy. The thermal energy in the porous high thermal conductivity structure 32 is communicated (e.g., transferred, absorbed, and the like) to the liquid 26 in the porous high thermal conductivity structure 32 to form a vapor 24. The vapor 24 flows out of the porous high thermal conductivity structure 32 into the vapor-filled area 16a. Subsequently, the vapor 24 is communicated (e.g., flows, moves, is transferred, or the like) through the semi-permeable structure 22 into the liquid-filled area 16b of the phase separation structure 16. In an embodiment, the vapor 24 condenses into the liquid 26 by contacting a bottom side surface of the liquid-filled area 16b or the liquid 26 in the liquid-filled area 16b. The thermal energy from the condensation process is transferred to the heat dissipater structure 42 disposed on the phase separation structure 16, where the thermal energy is spread and/or dissipated.

In an embodiment, the thermal ground plane structure 14a1 includes an actuator 52 disposed between the bottom of the phase separation structure 16 and the heat dissipater structure 42. The actuator 52 can include, but is not limited to, a piezoelectric actuator, a stack piezoelectric actuator, a capacitive actuator (e.g., DC/AC driven), a magnetic actuator, a hydraulic actuator, and a mechanic actuator, or an array of such actuators. Such actuators are well known to one skilled in the art. For example, the capacitive actuator and the piezoelectric actuator are described in X. C. Jin, I. Ladabaum, F. L. Degertekin, S. Calmes and B. T. Khuri-Yakub, "Fabrication and Characterization of Surface Micromachined Capacitive Ultrasonic Immersion Transducers", IEEE/ASME Journal of Microelectromechanical Systems, 8, pp. 100-114, 1999 and Meacham, J. M., Ejimofor, C., Kumar, S., Degertekin F. L., and Fedorov, A., "A Micromachined Ultrasonic Droplet Generator Based on Liquid Horn Structure", *Rev. Sci. Instrum.*, 75 (5), 1347-1352 (2004), each of which are incorporated herein by reference for the corresponding discussion. The dimensions of the actuator 52 depend on the type of actuator used and the size of the phase separation structure 16. The dimensions of the actuator 52 or the actuator array are about 100 μm to 100 cm in width, about 100 μm to 100 cm in length, and about 10 μm to 1 cm in thickness.

FIG. 3 illustrates a cross section (A-A) of the thermal ground plane 10 with the thermal energy source 12a and thermal ground plane structure 14a (noted as thermal ground plane structure 14a2 in FIG. 3) shown in FIG. 1. The thermal ground plane structure 14a2 is substantially the same as the embodiment shown in FIG. 2 except that this embodiment does not include an actuator 52. The vapor 24 contained in the vapor-filled area 16a of the phase separation structure 16 is communicated through the semi-permeable structure 22 via pressure-driven transport or via diffusion to the liquid-filled area 16b, where it condenses and becomes a liquid 26.

FIG. 4 illustrates a cross section (A-A) of the thermal ground plane 10 with the thermal energy source 12a and thermal ground plane structure 14a (noted as thermal ground plane structure 14a3 in FIG. 4) shown in FIG. 1. The thermal ground plane structure 14a3 is substantially the same as the embodiment shown in FIG. 3 except the semi-permeable structure 22 is flexible in the direction shown by the arrow 64. In an embodiment, the semi-permeable structure 22 can be an actuator or an actuator can be disposed adjacent a side of the semi-permeable structure so that the semi-permeable structure 22 can flex and assist in the communication of the vapor 24 through the semi-permeable structure 22 and/or with the communication of the liquid 26 in the liquid-filled area 16b to the porous high thermal conductivity structure 32.

Each of the embodiments of the semi-permeable structure described in reference to FIGS. 5 to 7B can be included in each of the embodiments described in reference to FIGS. 1 to 4.

FIG. 5 illustrates an embodiment of a semi-permeable structure is a semi-permeable membrane 72 having a plurality of micro/nanochannels 74 that extend a length from a top side to a bottom side of the semi-permeable membrane 72. The semi-permeable membrane 72 and the micro/nanochannels 74 have dimensions so that the liquid 26 does not flow through the micro/nanochannels 74 of the semi-permeable membrane 72. Although not intending to be bound by theory, the prohibitively large pressure drop across the semi-permeable membrane 72 due to a large viscosity and density of the liquid 26 prevents the liquid 26 from communicating (e.g., flowing, traveling, moving, and the like) through the micro/nanochannels 74. The vapor 24 can be communicated (e.g., flow, travel, move, and the like) through the micro/nanochannels 74 since the pressure drop required for the vapor 24 transport is not limited by the viscosity or density like the liquid 26.

In an embodiment, the ratio of the thickness (length of the micro/nanochannel 74) to the diameter of the micro/nanochannels 74 of the semi-permeable membrane 72 is about 10 to 10,000 or about 100 to 1000.

In an embodiment, the micro/nanochannels 74 can have a hydraulic diameter 76 of about 1 nm to 100 µm, and the length 78 is about 10 nm to 1 mm. In another embodiment, the micro/nanochannels 74 can have a hydraulic diameter 76 of about 10 nm to 1 µm, and the length 78 is about 1 µm to 100 µm. The term "hydraulic diameter" is commonly used as a characteristic dimension for noncircular tubes and channels which is equivalent (from the flow resistance prospective) to a diameter of a round pipe. It is defined as a ratio of four times a cross section area of the flow to the wetted pipe perimeter.

In an embodiment, the semi-permeable membrane 72 can have a thickness 78 of about 10 nm to 1 mm. In another embodiment, the semi-permeable membrane 72 can have a thickness 78 of about 1 µm to 100 µm.

The semi-permeable membrane 72 can be made of a material such as, but not limited to, porous alumina (aluminum oxide), porous silicon and silicon oxide, templated polymers, zeolites, porous carbon, and combinations thereof. In an embodiment, the material can be a material that substantially prevents or prevents the liquid from flowing through the micro/nanochannels 74. In an embodiment, the material has a hydrophobic characteristic.

In an embodiment, the bottom of the semi-permeable membrane 72 and/or all or part of the inside surface of the micro/nanochannels 74 is coated with a material to substantially prevent or prevent liquid 26 from flowing through the micro/nanochannels 74. In an embodiment, the material has a hydrophobic characteristic.

FIG. 6 illustrates an embodiment of a semi-permeable structure is a semi-permeable membrane 82 having a plurality of channels 84 that extend a length from a top side to a bottom side of the semi-permeable membrane 82. The semi-permeable membrane 82 can be made of a material and/or the semi-permeable membrane 82 can be coated with a material so that the liquid does not flow through the channels 84 but the vapor 24 is communicated (e.g., flow, move, travel, and the like) through the channels 84. Although not intending to be bound by theory, capillary forces and/or surface tension allow for the separation of the liquid 26 and the vapor 24, and the separation is dictated by the diameter of the channels 84 and/or the contact angle of the liquid 26 with the channels 84.

In an embodiment, the semi-permeable membrane 82 can be made of a material such as, but not limited to, porous alumina, porous silicon and silicon oxide, templated polymers, zeolite, porous carbon, and combinations thereof. In an embodiment, the material can be a material that substantially prevents or prevents the liquid 26 from communicating through the channels 84. In an embodiment, the bottom of the semi-permeable membrane 82 and/or all or part of the inside surface of the channels 84 is coated with a material to substantially prevent or prevent liquid 26 from communicating through the channels while allowing the vapor to communicate through the channels 84. In an embodiment, the material can have a hydrophobic characteristic.

In an embodiment, the ratio of the thickness (or length of the channel 84) to the hydraulic diameter of the channels 84 of the semi-permeable membrane 82 is about is about 1 to 10,000 or about 10 to 100.

In an embodiment, the channels 84 can have a thickness 88 (or length of the channel 84) of about 10 nm to 1 mm, and the hydraulic diameter 86 is about 10 nm to 10 µm. In another embodiment, the channels 84 can have a hydraulic diameter 86 of about 50 nm to 500 nm, and the length 88 is about 500 nm to 10 µm.

In an embodiment, the semi-permeable membrane 82 can have a thickness 88 of about 10 nm to 1 mm. In another embodiment, the semi-permeable membrane 82 can have a thickness 88 of about 500 nm to 10 µm.

In an embodiment, the contact angle between the liquid 26 and the channels 84 is about 90° to 180°. In an embodiment, the contact angle between the liquid 26 and the channels 84 is about 120° to 150°.

FIGS. 7A and 7B illustrate an embodiment of a semi-permeable structure is a semi-permeable membrane 102 having a plurality of channels 104 that extend a length from a top side to a bottom side of the semi-permeable membrane 102. In addition, the semi-permeable membrane 102 includes check-valves 106 for each channel 104 that substantially prevent or prevent the communication of the liquid 26 from the liquid-filled area 16b to the vapor-filled area 16a of the phase separation structure 16, while allowing the vapor 26 to be communicated through the channels 104. As shown in FIGS. 7A and 7B, an actuator 108 can be used to assist in the communication of the vapor 24 through the channels 104 by indirectly opening and closing the check-valves 106. In another embodiment, an actuator 108 is not needed and the check-valves 106 are opened due to the vapor pressure in the vapor-filled area 16a of the phase separation structure 16. In an embodiment, the check-valves 106 can be replaced by another structure that serves the same purpose of the check-valves 106 so that the other structure permits communication of the vapor 24 through the channels 104 and substantially prevents or prevents the communication of the liquid 26 from the liquid-filled area 16b to the vapor-filled area 16a of the phase separation structure 16.

In an embodiment, the ratio of the thickness 118 (or length of the channel 104) to the width 116 of the channels 104 to of the semi-permeable membrane 102 is about 0.001 to 1000 or about 0.1 to 10.

In an embodiment, the channels 104 can have a thickness 118 (or length of the channel 104) of about 100 nm to 1 mm and the width 116 is about 100 nm to 1 mm. In another embodiment, the channels 104 can have a width 116 of about 10 µm to 100 µm and the length 118 is about 10 µm to 500 µm.

In an embodiment, the semi-permeable membrane 102 can have a thickness 118 of about 100 nm to 1 mm. In another embodiment, the semi-permeable membrane 102 can have a thickness 118 of about 10 μm to 500 μm.

In an embodiment, the check-valves 106 are the leaf-let valves or microfabricated flexible membrane valves, or other designs that enable the controlled unidirectional flow of the liquid from the vapor-filled area 16a to the liquid-filled area 16b. The dimensions of the check-valves 106 depend, in part, upon the area of the opening of the channels 104. In an embodiment, the check-valves 106 are of sufficient size to cover the opening of the channels 104. The check-valves 106 can be made of materials such as, but not limited to, aluminum, cupper, silicon, and polymers.

For each of the embodiments described herein, and in particular, the embodiments described in FIGS. 5 to 7B, the semi-permeable structure can be a flexible structure. In an embodiment, the semi-permeable structure can be an actuator or an actuator can be disposed adjacent a side of the semi-permeable structure so that the semi-permeable structure can flex and assist in the communication of the vapor through the semi-permeable structure and/or with the communication of the liquid to the porous high thermal conductivity structure. In another embodiment, the semi-permeable structure can be a combination of two or more of the features described in the embodiments associated with FIGS. 5 to 7B.

Further, for each of the embodiments described herein, and in particular, the embodiments described in FIGS. 5 to 7B, the semi-permeable structure can be disposed on a supporting structure that provides mechanical strength and structural support for the semi-permeable structure. This can include, for example, an array of posts (not shown in FIGS.) connecting the semi-permeable structure to the walls of the phase separation structure 16 or a thicker macroporous supporting layer (not shown) upon which is placed the semi-permeable structure 22.

It should be noted that the micro/nanochannel or channel described in reference to FIGS. 5 to 7B can be voids (no material), as shown, or in an embodiment could be a material that permits vapor to communicate through the micro/nanochannel or channel, while substantially preventing or preventing the liquid to communicate through the micro/nanochannel or channel. In an embodiment, the material can include, but is not limited to, porous carbon, porous silicon, porous alumina, zeolites, porous polymers, among others.

In general, embodiments of the present disclosure operate in a manner described below. As noted above, embodiments of the present disclosure provide for methods of removing (e.g., spreading, dissipating, and the like) thermal energy in a thermal ground plane. Initially, the thermal ground plane structure includes a liquid partially filling the phase separation structure including liquid-filled area 16b and the porous high thermal conductivity structure 32. A thermal energy source generates thermal energy. Since the thermal energy source is adjacent the thermal ground plane structure, the thermal energy is communicated from the thermal energy source to the porous high thermal conductivity structure, which absorbs the thermal energy. Then, the thermal energy is communicated to the liquid in the porous high thermal conductivity structure, where the liquid absorbs the thermal energy. The liquid increases in temperature and is vaporized (e.g., boiled/evaporated) upon the liquid absorbing the thermal energy from the porous high thermal conductivity structure. The vapor is communicated (e.g., flows) from the porous high thermal conductivity structure into the vapor-filled area 16a of the phase separation structure. The vapor is communicated through the semi-permeable structure into the liquid-filled area (shown as a bottom area) of the phase separation structure. Once in the liquid-filled area, the vapor is condensed into a liquid in the liquid-filled area. The condensation could occur by contacting a bottom and side surface of the liquid-filled area 16b of the phase separation structure, the liquid in the liquid-filled area 16b, the porous high thermal conductivity structure, or a combination thereof. The thermal energy from the condensation process is communicated to the heat dissipater structure disposed on a surface of the phase separation structure (shown at the bottom surface in FIG. 2, but could also be attached at the side surface), where the thermal energy is rejected to the environment away from the thermal ground plane.

In an embodiment including an actuator, the movement of the actuator can assist in the communication of the vapor and/or transport of liquid coolant. In an embodiment including an actuator and the check-valves, the movement of the actuator can cause the check-valves to open to allow the vapor to be communicated from the vapor-filled area 16a to the liquid-filled area 16b of the phase separation structure, while substantially preventing or preventing the liquid to flow from the liquid-filled area 16b to the vapor-filled area 16a of the phase separation structure.

In any of the embodiments including an actuator, the actuator could be more than one actuator (i.e., an array of actuators) and, in such a case, the actuator can flex in a complex shape/trajectory to control the volume and pressure in the vapor-filled area 16a and/or liquid-filled area 16b of the phase separation structure 16.

An embodiment of the present disclosure has one or more of the following advantages over the conventional, state-of-the-art fluidic spreader, which originate from the structural characteristics of the disclosed system: (1) having a semi-permeable structure that separates the phase separation structure into two communicating domains (liquid-filled area and vapor-filled area), (2) having an actuator that allows for active pumping of the liquid/vapor towards/away from the porous high conductivity structure where phase change takes place, and (3) having a heat dissipater structure disposed over a portion of the entire external surface of the liquid-filled area for efficient rejection of the dissipated heat to the environment upon liquid condensation. Separation of vapor-filled area and liquid-filled area and/or the use of the actuator allows for much more efficient liquid circulation within the thermal ground plane, thus increasing the amount of heat that can be dissipated from the thermal energy source as well as increasing the active area of the thermal ground plane that can be used for heat spreading and eventual rejection to the environment. In addition, use of active liquid pumping by an actuator allows for on-demand control of the circulation flow rate of the liquid, thus broadening the range of operation (i.e., with respect to minimal and maximum heat dissipation) of the thermal ground plane. Further, separation of vapor-filled area and liquid-filled area allows for an optimal design of the geometric form-factor and internal pore structure of the porous high conductivity structure where boiling/evaporation takes place by using much smaller in size pores promoting capillary drawing-in (intake) of the liquid coolant where the porous high conductivity structure interfaces with the liquid-filled area, and much larger in size pores promoting low flow resistance escape of the generated coolant vapor where the porous high conductivity structure interfaces with the vapor-filled area.

None of the above mentioned features of a disclosed system can be realized in conventional, state-of-the-art fluidic heat spreaders.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±1%, ±2%, ±3%, ÷4%, ±5%, or ±10%, of the numerical value(s) being modified. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

Therefore, the following is claimed:

1. A thermal ground plane structure, comprising:
a phase separation structure having a vapor-filled area and a liquid-filled area, wherein the vapor-filled area and the liquid-filled area are separated by a semi-permeable structure, wherein the semi-permeable structure permits a vapor to be communicated from the vapor-filled area to the liquid-filled area and substantially prevents a liquid from being communicated from the liquid-filled area to the vapor-filled area;
a porous high thermal conductivity structure disposed in a portion of the phase separation structure, wherein one side of the porous high thermal conductivity structure is adjacent to a thermal energy source, is in fluidic communication with a vapor-filled area of the phase separation structure, and extends into a portion of the liquid-filled area of the phase separation structure, wherein the porous high thermal conductivity structure passes through an opening in the semi-permeable structure so that the semi-permeable structure is adjacent one or more sides of the porous high thermal conductivity structure, wherein the porous high thermal conductivity structure absorbs liquid through capillary action so that liquid from the liquid-filled area is communicated into a portion of the porous high thermal conductivity structure that extends into the vapor-filled area; and
a heat dissipater structure disposed on an external area of the liquid-filled area of the phase separation structure;
wherein the porous high thermal conductivity structure is adjacent a thermal energy source so that thermal energy from the thermal energy source is transferred to the porous high thermal conductivity structure, wherein the porous high thermal conductivity structure absorbs the thermal energy, wherein the porous high thermal conductivity structure transfers the thermal energy to the liquid in the porous high thermal conductivity structure to form a vapor, wherein the vapor is communicated out of the porous high thermal conductivity structure into the vapor-filled area, wherein the vapor is communicated through the semi-permeable structure into the liquid-filled area, wherein the vapor condenses into the liquid, wherein thermal energy from the condensation process is transferred to the heat dissipater structure disposed on an external surface of the phase separation structure.

2. The thermal ground plane structure of claim 1, wherein the semi-permeable structure is a semi-permeable membrane having a plurality of micro/nanochannels that extend a length from a top side to a bottom side of the semi-permeable membrane, wherein the micro/nanochannels have a hydraulic diameter of about 1 nm to 100 μm, and the length is about 10 nm to 1 mm.

3. The thermal ground plane structure of claim 2, wherein the semi-permeable membrane is made of a material selected from the group consisting of: a porous alumina, a porous silicon oxide, silicon oxide, a templated polymer, a zeolite, porous carbon, and a combination thereof.

4. The thermal ground plane structure of claim 2, wherein the semi-permeable membrane is coated with a hydrophobic coating.

5. The thermal ground plane structure of claim 1, wherein the semi-permeable structure is a semi-permeable membrane having a plurality of channels that extend a length from a top side to a bottom side of the semi-permeable membrane, wherein the channels have a hydraulic diameter of about 10 nm to 10 μm, and the length is about 10 nm to 1 mm, and wherein the semi-permeable membrane is hydrophobic.

6. The thermal ground plane structure of claim 5, wherein the walls of the channels in the semi-permeable structure are hydrophobic.

7. The thermal ground plane structure of claim 6, wherein the walls of the channels in the semi-permeable structure are coated with a hydrophobic coating.

8. The thermal ground plane structure of claim 6, wherein the semi-permeable membrane is made of a material selected from the group consisting of: a porous alumina, a porous silicon oxide, silicon oxide, a templated polymer, a zeolite, porous carbon, and a combination thereof.

9. The thermal ground plane structure of claim 1, wherein the semi-permeable structure includes a structure having channels having check-valves, wherein the check-valves open to allow vapor to flow through the channels in the semi-permeable structure, wherein the check-valves close so liquid does not flow through the channels in the semi-permeable structure.

10. The thermal ground plane structure of claim 1, wherein the semi-permeable structure is flexible.

11. The thermal ground plane structure of claim 1, wherein the porous high thermal conductivity structure is made of a material selected from the group consisting of: copper, aluminum, silicon, diamond, brass, carbon, arrays of nanotubes and nanowires, and a combination thereof.

12. The thermal ground plane structure of claim 1, wherein the porous high thermal conductivity structure has a thermal conductivity of about 100 to 5000 W/mK.

13. The thermal ground plane structure of claim 1, wherein the heat dissipater structure comprises fins, wherein the surface of the fins comprise at least a portion of the heat dissipater structure.

14. The thermal ground plane structure of claim 1, wherein the heat dissipater structure is made of a material selected from the group consisting of: copper, aluminum, silicon, diamond, steel, carbon, a polymer, a composite material, and a combination thereof.

15. The thermal ground plane structure of claim 1, further comprising an actuator disposed between one side of the phase separation structure and the heat dissipater structure.

16. The thermal ground plane structure of claim 15, wherein the actuator is selected from the group consisting of: a piezoelectric actuator, a stack piezoelectric actuator, a capacitive actuator, a magnetic actuator, a hydraulic actuator, a mechanic actuator, an array of any one of the actuators, and a combination of these actuators.

17. The thermal ground plane structure of claim 1, wherein the liquid is water.

18. A method of removing and spreading thermal energy in a thermal ground plane, comprising:
providing a thermal ground plane structure that includes:
a phase separation structure having a vapor-filled area and a liquid-filled area, wherein the vapor-filled area and the liquid-filled area are separated by a semi-permeable structure, wherein the semi-permeable structure permits a coolant vapor to be communicated from the vapor-filled area to the liquid-filled area and does not permit liquid to be communicated from the liquid-filled area to the vapor-filled area;
a porous high thermal conductivity structure disposed in a portion of the phase separation structure, wherein one side of the porous high thermal conductivity structure is adjacent to a thermal energy source, is in fluidic communication with a vapor-filled area of the phase separation structure, and extends into a portion of the liquid-filled area of the phase separation structure, wherein the porous high thermal conductivity structure passes through an opening in the semi-permeable structure so that the porous high thermal conductivity structure is disposed in both the vapor-filled area and the liquid-filled area of the phase separation structure, wherein the opening of the semi-permeable structure is adjacent one or more sides of the porous high thermal conductivity structure, wherein the porous high thermal conductivity structure absorbs liquid through capillary action so that liquid from the liquid-filled area is communicated into a portion of the porous high thermal conductivity structure that extends into the vapor-filled area and in contact with the thermal energy source;
a heat dissipater structure disposed on an external surface of the liquid-filled area of the phase separation structure not within the liquid-filled area;
a liquid disposed in the thermal ground plane structure; and
a thermal energy source disposed adjacent the porous high thermal conductivity structure thermal energy;
generating thermal energy from the thermal energy source;
communicating the thermal energy from the thermal energy source to the porous high thermal conductivity structure, which absorbs the thermal energy;
communicating the thermal energy absorbed by the porous high thermal conductivity structure to the liquid in the porous high thermal conductivity structure, wherein the liquid absorbs the thermal energy;
generating vapor from the liquid upon the liquid absorbing the thermal energy from the porous high thermal conductivity structure, wherein the vapor flows out of the porous high thermal conductivity structure into the vapor-filled area;
communicating the vapor through the semi-permeable structure into the liquid-filled area;
condensing the vapor into a liquid in the liquid-filled area; and
communicating the thermal energy from the condensation process to the heat dissipater structure disposed on an external surface of the phase separation structure.

19. The method of claim 18, wherein the semi-permeable structure is a semi-permeable membrane having a plurality of micro/nanochannels that extend a length from a vapor-filled area to a liquid-filled area of the semi-permeable membrane, and
communicating the vapor through the micro/nanochannels to the liquid-filled area of the semi-permeable membrane.

20. The method of claim 18, wherein the semi-permeable structure is a semi-permeable membrane having a plurality of channels that extend a length from a vapor-filled area to a liquid-filled area of the semi-permeable membrane, wherein the liquid-facing area of the semi-permeable membrane is hydrophobic, and
communicating the vapor through the channels to the liquid-filled area of the semi-permeable membrane.

21. The method of claim 18, wherein the semi-permeable structure includes a structure having channels having check-valves,
communicating the vapor through the check-valves from the vapor-filled area to the liquid-filled area, wherein the check-valves close so liquid is not communicated through the channels from the liquid-filled area to the vapor-filled area.

22. The method of claim 18, further comprising an actuator disposed between the liquid-filled area of the phase separation structure and the heat dissipater structure,
actuating the actuator, which causes the liquid to flow into the porous high thermal conductivity structure.

23. A method of removing and spreading thermal energy in a thermal ground plane, comprising:
providing a thermal ground plane structure that includes:
a phase separation structure having a vapor-filled area and a liquid-filled area, wherein the vapor-filled area and the liquid-filled area are separated by a semi-permeable structure, wherein the semi-permeable structure permits a coolant vapor to be communicated from the vapor-filled area to the liquid-filled area and does not permit liquid to be communicated from the liquid-filled area to the vapor-filled area;
a porous high thermal conductivity structure disposed in a portion of the phase separation structure, wherein one side of the porous high thermal conductivity structure is adjacent to a thermal energy source, is in fluidic communication with a vapor-filled area of the phase separation structure, and extends into a portion of the liquid-filled area of the phase separation structure, wherein the porous high thermal conductivity structure passes through an opening in the semi-permeable structure so that the porous high thermal conductivity structure is disposed in both the vapor-filled area and the liquid-filled area of the phase separation structure, wherein the opening of the semi-permeable structure is adjacent one or more sides of the porous high thermal conductivity structure;
a heat dissipater structure disposed on an external surface of the liquid-filled area of the phase separation structure not within the liquid-filled area;
a liquid disposed in the thermal ground plane structure; and a thermal energy source disposed adjacent the porous high thermal conductivity structure thermal energy;

generating thermal energy from the thermal energy source;

communicating the thermal energy from the thermal energy source to the porous high thermal conductivity structure, which absorbs the thermal energy;

communicating the thermal energy absorbed by the porous high thermal conductivity structure to the liquid in the porous high thermal conductivity structure, wherein the liquid absorbs the thermal energy;

generating vapor from the liquid upon the liquid absorbing the thermal energy from the porous high thermal conductivity structure, wherein the vapor flows out of the porous high thermal conductivity structure into the vapor-filled area;

communicating the vapor through the semi-permeable structure into the liquid-filled area;

condensing the vapor into a liquid in the liquid-filled area; and communicating the thermal energy from the condensation process to the heat dissipater structure disposed on an external surface of the phase separation structure.

* * * * *